(12) United States Patent
Gass et al.

(10) Patent No.: US 10,622,800 B2
(45) Date of Patent: Apr. 14, 2020

(54) INTEGRATED ARC FAULT AND GROUND FAULT CURRENT SENSING PACKAGE

(71) Applicant: SCHNEIDER ELECTRIC USA, INC., Andover, MA (US)

(72) Inventors: Randall J Gass, Cedar Rapids, IA (US); Jason Potratz, Coralville, IA (US); Dennis W Fleege, Cedar Rapids, IA (US)

(73) Assignee: Schneider Electric USA, Inc., Andover, MA (US)

( * ) Notice: Subject to any disclaimer, the term of this patent is extended or adjusted under 35 U.S.C. 154(b) by 265 days.

(21) Appl. No.: 15/672,744

(22) Filed: Aug. 9, 2017

(65) Prior Publication Data

US 2019/0052072 A1 Feb. 14, 2019

(51) Int. Cl.
| | | |
|---|---|---|
| *H02H 1/00* | (2006.01) | |
| *H01H 83/22* | (2006.01) | |
| *G01R 31/02* | (2006.01) | |
| *G01R 31/28* | (2006.01) | |
| *H02H 3/33* | (2006.01) | |
| *H01H 83/14* | (2006.01) | |
| *H01H 83/20* | (2006.01) | |

(Continued)

(52) U.S. Cl.
CPC ......... *H02H 1/0015* (2013.01); *G01R 31/025* (2013.01); *G01R 31/2801* (2013.01); *H01H 83/226* (2013.01); *H02H 3/331* (2013.01); *H02H 3/334* (2013.01); *H01H 2083/146* (2013.01); *H01H 2083/148* (2013.01); *H01H 2083/201* (2013.01); *H02H 3/08* (2013.01); *H02H 3/105* (2013.01); *H02H 3/16* (2013.01); *H02H 3/33* (2013.01)

(58) Field of Classification Search
CPC ...... H02H 1/0015; H02H 3/331; H02H 3/334; G01R 31/025; G01R 31/2801; H01H 83/226; H01H 2083/146; H01H 2083/148; H01H 2083/201
USPC ........................................................ 324/536
See application file for complete search history.

(56) References Cited

U.S. PATENT DOCUMENTS 3,617,809 A 11/1971 Penn et al.
3,683,302 A 8/1972 Butler et al.
(Continued)

FOREIGN PATENT DOCUMENTS

EP 0076999 4/1983
EP 0769197 4/1997

OTHER PUBLICATIONS

English Language Machine Translation of European Patent Application Publication No. EP0076999, dated Apr. 20, 1983, 4 pages.
(Continued)

*Primary Examiner* — Melissa J Koval
*Assistant Examiner* — Rahul Maini
(74) *Attorney, Agent, or Firm* — Locke Lord LLP

(57) ABSTRACT

The line power and neutral conductors for an arc fault sensing circuit interrupter such as in a miniature circuit breaker are arranged as a rigid conductor surrounding and holding an insulated flexible conductor when passing through the Ground Fault Interrupter current transformer. Voltage metering takes place across the rigid conductor to enable arc fault detection and ground fault detection in the miniature circuit breaker within the space of a single current transformer.

20 Claims, 5 Drawing Sheets

(51) Int. Cl.
*H02H 3/16* (2006.01)
*H02H 3/10* (2006.01)
*H02H 3/08* (2006.01)

(56) References Cited

U.S. PATENT DOCUMENTS

| | | | |
|---|---|---|---|
| 3,725,741 A * | 4/1973 | Misencik | H01F 38/30 |
| | | | 361/45 |
| 3,736,468 A | 5/1973 | Reeves et al. | |
| 4,507,709 A * | 3/1985 | Morris | H01H 83/02 |
| | | | 174/53 |
| 5,341,281 A | 8/1994 | Skibinski | |
| 5,841,616 A | 11/1998 | Crosier | |
| 6,232,857 B1 | 5/2001 | Mason, Jr. et al. | |
| 7,639,461 B2 * | 12/2009 | DiSalvo | H02H 3/334 |
| | | | 361/42 |
| 2003/0223161 A1 | 12/2003 | Elms et al. | |

OTHER PUBLICATIONS

Extended European Search Report for European Patent Application No. 18186692.2 dated Nov. 20, 2018, 5 pages.

* cited by examiner

INTEGRATED ARC FAULT AND GROUND FAULT CURRENT SENSING PACKAGE

BACKGROUND OF THE INVENTION

1. Field of the Invention

The present invention relates to Dual Function (Arc Fault and Ground Fault) circuit interrupters or Arc Fault breakers that utilize ground fault sensing as part of the fault detection methods, collectively referred to herein as "arc fault sensing" circuit breakers or interrupters, and particularly to such arc fault sensing miniature circuit breakers and outlet receptacles found most commonly in residential use.

2. Discussion of the Art

FIG. 1 illustrates the basics of a known circuit breaker 10 of the Ground Fault Interrupter type with a schematic representation therein of the line power current path 11. The line current path starts at the line power terminal 13 of the breaker 10 and continues through the separable contacts 15 and a toroidal current transformer current sensor 17 to the load terminal 18 which is wired out to the branch load 22, here represented as a motor. A mechanical "side" or portion 16 of the circuit breaker 10 contains thermal and magnetic trip units 19, typically a bimetal and a magnetic yoke assembly, respectively, which are components for tripping, i.e. separating, the contacts 15, in the event of overcurrent conditions.

An electronic "side" or portion 20 of the arc fault sensing circuit breaker 10 contains the current sensor in the form of current transformer 17, and associated electronics 21 for evaluation of Ground Fault events. The electronics 21 control an actuator 23, typically a solenoid, whose function is also to trip the separable contacts 15 and remove power from the load 22.

The return neutral current path 24 from the load 22 travels from the load 22 to the neutral terminal 28 through the current transformer current sensor 17 and out to the neutral return wire 26. It will be appreciated that a plug on neutral type breaker will have a terminal clip rather than the illustrated pigtail wire.

The current flow direction of the power conductors and the neutral conductors are in the opposite directions when they are routed through the Ground Fault current transformer 17 sensor housing. Each current carrying conductor will produce a magnetic flux which is in compliance with the "Right Hand Rule" used to determine flux direction. When the two conductors are carrying the same level of current in opposite directions, the flux of one conductor will cancel the flux from the other conductor. This then has a net flux value of zero. If there is an equal current exiting and then returning back through the Ground Fault circuit breaker, the Ground Fault sensor will output no signal. If there is an imbalance of current in the circuit wires, then the Ground Fault Interrupter sensor will output a current proportional to the current imbalance and if this imbalance exceeds a predetermined threshold, the Ground Fault circuit breaker will detect the presence of a ground fault and interrupt the electrical circuit.

A recognized problem with Ground Fault Interrupter sensors is that if the conductors are not located properly in the sensor, uneven magnetic fields throughout the current sensor assembly can cause an output current from the current sensor, even when the total current through the conductor paths are balanced. The result is an inaccuracy in the current sensor output known as load shift error. Typically this error is compensated for by twisting the main conductors (line and neutral) as they pass through the Ground Fault current transformer. It has been proposed, e.g. by U.S. Pat. No. 3,725,741 to Misencik, to replace the twisted pair of main conductors (line and neutral) with a rigid tubular outer conductor surrounding an insulated flexible conductor passing through the aperture of the Ground Fault Interrupter current transformer.

In a Dual Function (DF) circuit breaker both Ground Fault Interrupter (GFI) and Arc Fault Interrupter (AFI) functions are included. Hence, in the known art, another current transformer (not shown) is typically added to measure for current anomalies indicative of an arc fault event. One of the primary current conductors, i.e. the line or neutral current wire, is routed through both the Ground Fault and Arc Fault current transformers with the other wire passing through the ground fault sensor only. Of course, available space to contain current transformers and route wires is at a premium within the confines of a miniature circuit breaker. Within the known art, it has also been proposed to measure a voltage drop across an already present conductor to detect arc fault current anomalies. U.S. Pat. No. 6,232,857 to Mason Jr. et al., provides that the bimetal of a thermal resistive trip unit in an Arc Fault Interrupter circuit breaker may be used to detect such arc fault currents.

SUMMARY OF THE INVENTION

The line power and neutral conductors for an arc fault sensing miniature circuit breaker are arranged as an improved rigid conductor surrounding and holding an insulated flexible conductor when passing through the Ground Fault Interrupter current transformer.

An Integrated Arc Fault and Ground Fault current sensing package utilizes a so-called "faux coax bus bar" i.e. a rigid conductor encompassing and holding a flexible insulated conductor, passing through the current transformer core in place of twisted wires to help control ground fault load shift performance inside the Ground Fault current sensor. Aspects of the present invention can be used to sense line current draw by means of voltage drop across the faux coax bus bar for detection of arcing faults in the system. The integration of the line current sensing into the faux coax bus bar effectively places a line current sensor inside the space also utilized for Ground Fault sensing, thus eliminating the need for an Arc Fault current transformer. The faux coax arrangement also provides a more consistent routing path for the Line and Neutral wires to obtain a more consistent load shift performance while also eliminating the need for a twisted wire assembly.

In one aspect. the present invention provides for a dual function (AF/GF) miniature circuit breaker with line power and neutral power current paths and an apertured current transformer for the detecting of ground fault current anomalies, comprising: a rigid conductor surrounding and holding a flexible conductor; the rigid conductor and the flexible conductor passing through the aperture of the Ground Fault current transformer inside of the miniature circuit breaker; and a voltage meter measuring a voltage drop across the rigid conductor and reporting the voltage drop measurements to an Arc Fault Detector.

In some aspects of the present invention the rigid conductor is connected to and forms a part of the current path of the Neutral connection. Alternatively, the rigid conductor could form a part of the Line power connection and the neutral line could be connected through the flexible conductor encompassed and held by the rigid conductor. The rigid conductor can also have features placed therein to create increased resistance to the flow of current such as where the electrical resistance feature in the rigid conductor is created by a narrowed wall thickness in a section of the substantially tubular form.

Other aspects of the present invention offer an improvement to a Ground fault interrupter apparatus of the arc fault sensing type comprising a current transformer with an apertured magnetic core; a printed circuit board with electronics for detection of ground fault events; first and second primary conductors extending through the core; the first primary conductor being a substantially rigid conductor with a tubular portion located inside the core and further having nontubular second and third portions outside the core extending at angles to the tubular portion, one of the second or third portions secured to the printed circuit board; the second primary conductor being a flexible wire held inside the tubular portion of the first primary conductor in a substantially coaxial arrangement; the current sensor further having a secondary winding comprising a plurality of turns on the core; a trip circuit responsive to sensed signals on the secondary winding; and a voltage meter connected across the substantially rigid conductor for detection of arc fault currents. In some aspects the miniature circuit breaker may have one of the voltage meter leads attached to the printed circuit board. In other aspects the tubular portion of the rigid conductor may not form a fully closed tube.

BRIEF DESCRIPTION OF THE DRAWINGS

The foregoing and other advantages of the disclosed embodiments will become apparent upon reading the following detailed description and upon reference to the drawings, wherein.

DETAILED DESCRIPTION

As an initial matter, it will be appreciated that the development of an actual commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Words of degree, such as "about," "substantially," and the like are used herein in the sense of "at, or nearly at, when given the manufacturing, design, and material tolerances inherent in the stated circumstances" and are used to prevent the unscrupulous infringer from unfairly taking advantage of the invention disclosure where exact or absolute figures and operational or structural relationships are stated as an aid to understanding the invention.

The person of ordinary skill in the art will appreciate that the well known components of an electronic miniature circuit breaker unnecessary to the exposition of the present invention are not described in detail here, but will be understood to be present in a functioning circuit interrupter as briefly explained above. While shown here in the context of a miniature circuit breaker it will be appreciated by those in the art that the invention may be applicable to other forms of arc fault sensing circuit interrupter devices, such as receptacles, or monitoring systems.

Figure 1:
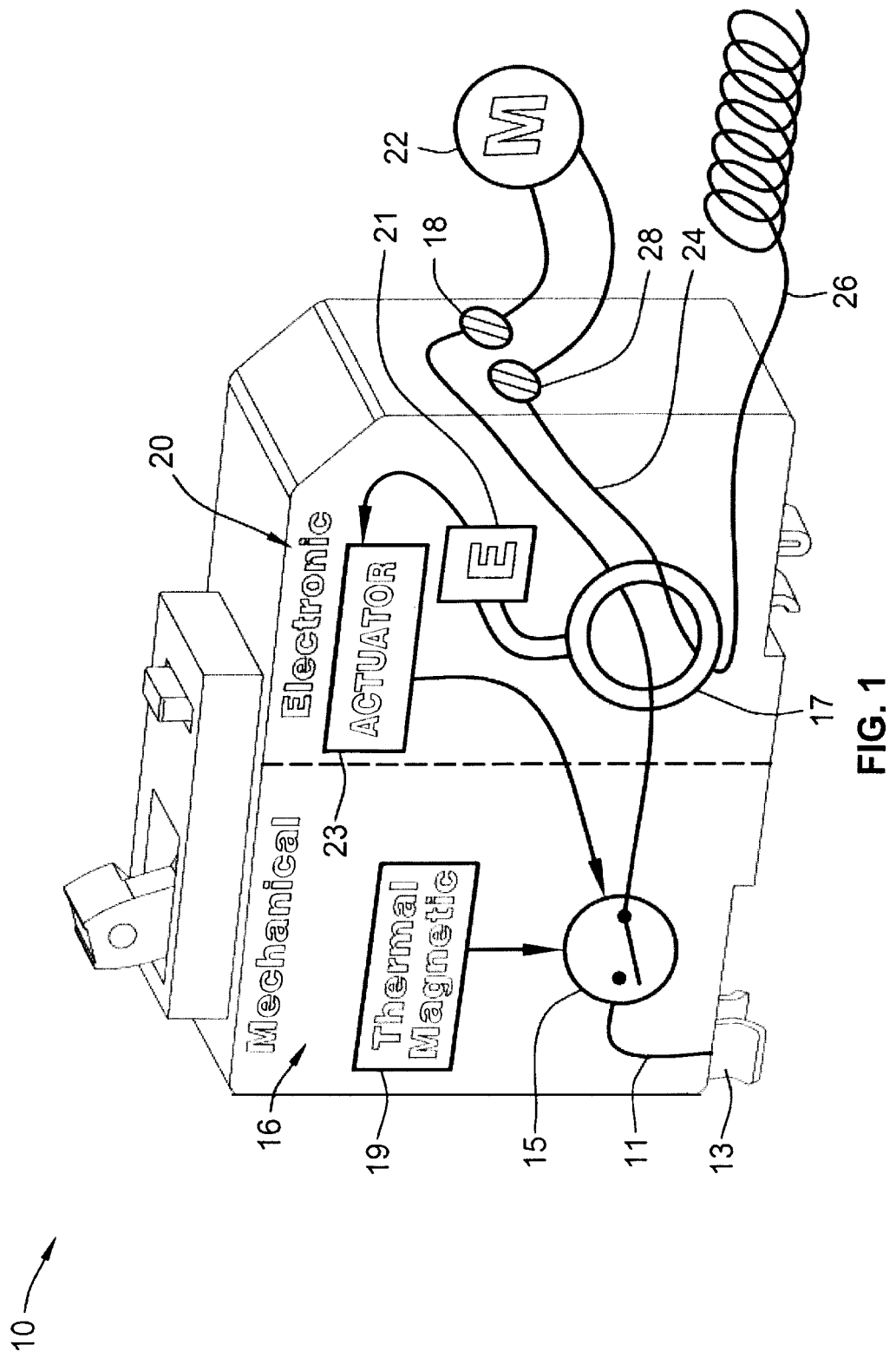
FIG. 1 is a schematic illustration of the working parts of an exemplary arc fault sensing circuit breaker as known in the art.
Figure 2:
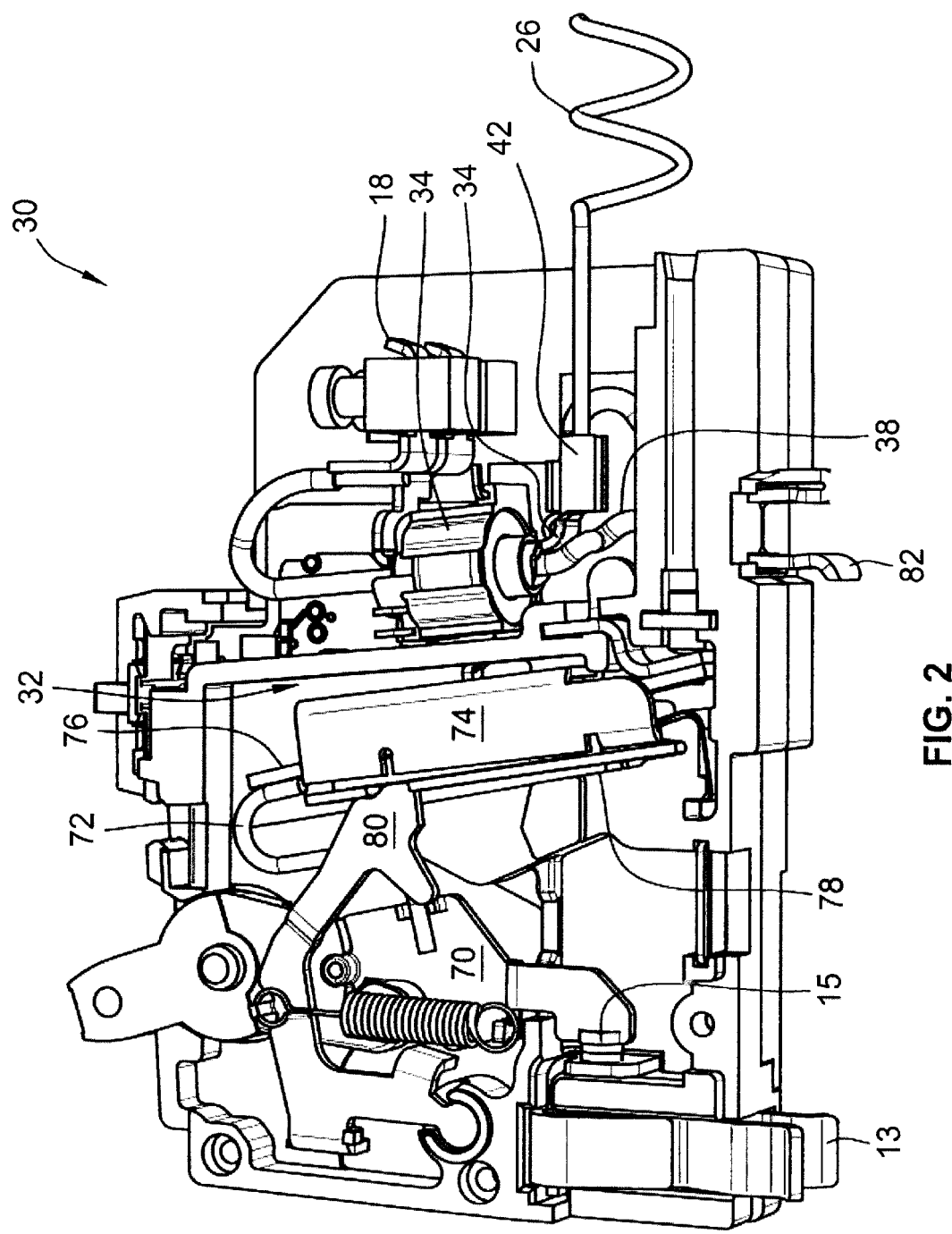
FIG. 2 is a view of the interior of the mechanical side or layer of an arc fault sensing circuit breaker of the present invention.

FIG. 2 illustrates the "mechanical side," i.e. portion, of a partially constructed arc fault sensing circuit breaker 30 according to certain aspects of the present invention. The terms "side" and "portion" are used herein to convey the sense of a functional grouping which may or may not exist as discrete physical layouts within the design of the breaker. Further, some common reference numbering between FIG. 1 and the remaining figures may be used herein where the component functionalities are substantially in common between the two. The line (power) current path starts at the line power terminal 13 of the breaker 30 and continues through the separable contacts 15 into the movable contact arm 70 and travels by wire 72 through the mechanical trip portions of the yoke 74 and bimetal 76 which cause the mechanical trip by separating the latch plate 78 of the yoke 74 from the trip lever 80. The current path then passes through the Ground Fault Interrupter current transformer 34, as further explained below, before exiting to the load terminal 18 which is wired out to the branch load 22 (FIG. 1).

Figure 3:
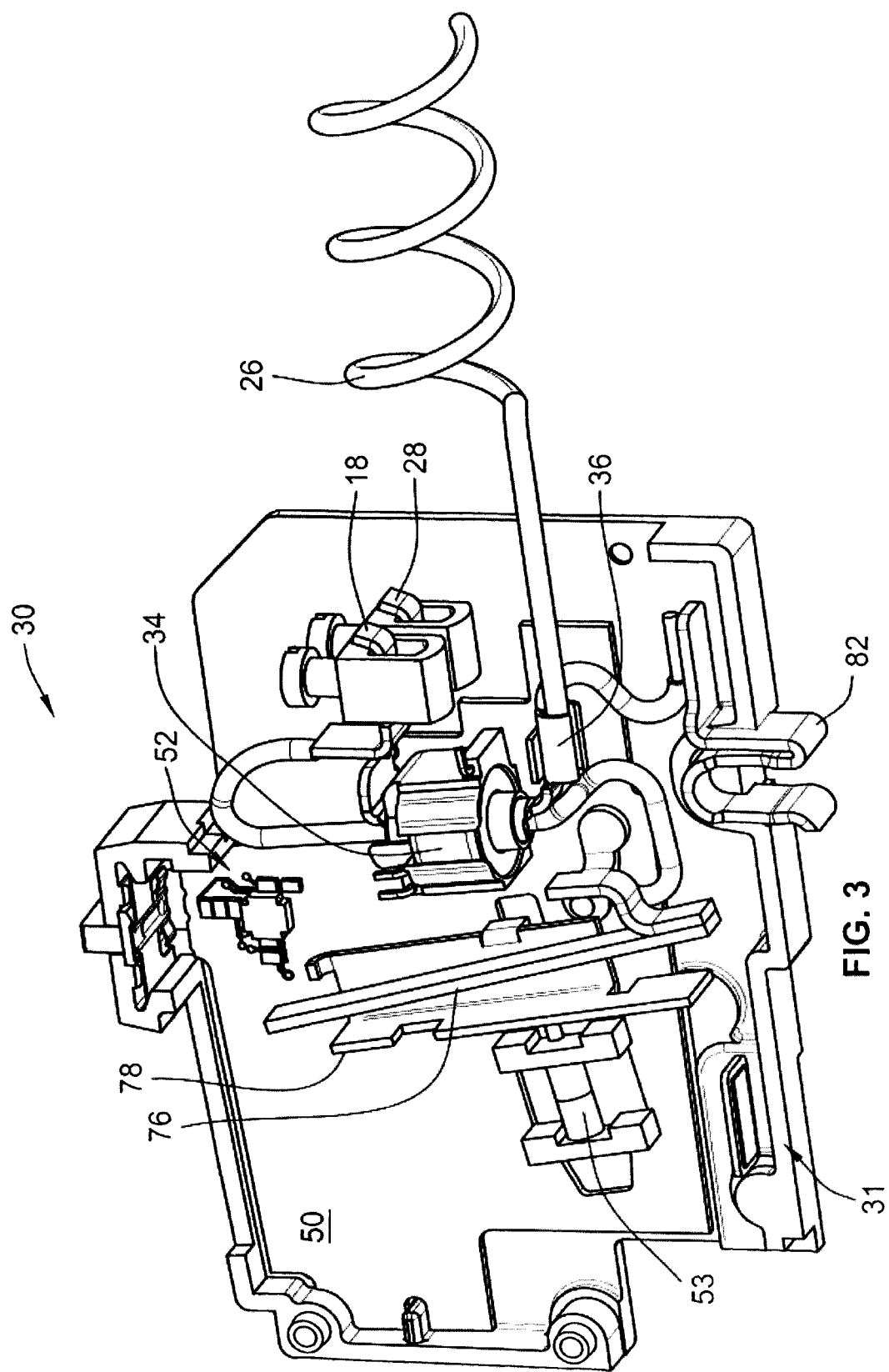
FIG. 3 is an exploded view of the electronics side of the circuit breaker of FIG. 2 of the present invention.

FIG. 3 illustrates the electronic "side," i.e. portion, 31 of the arc fault sensing circuit breaker 30 containing the current transformer current sensor 34, and associated electronics 52 mounted to a PCB 50 for evaluation of Ground Fault and Arc Fault events. The electronics 52 control a solenoid actuator 53 whose function is also to move the latch plate 78 (FIG. 2) from the trip lever 80 to trip the separable contacts 15 and remove power from the load (not shown). The return (Neutral) current path from the load travels from the Neutral return terminal 28, which is a second end of the rigid conductor 36, through the current sensor current transformer 34, as further explained below, and out to the neutral return wire (pigtail) 26 and the plug on neutral clip 82, both of which are shown here for the sake of explanation.

Figure 4:
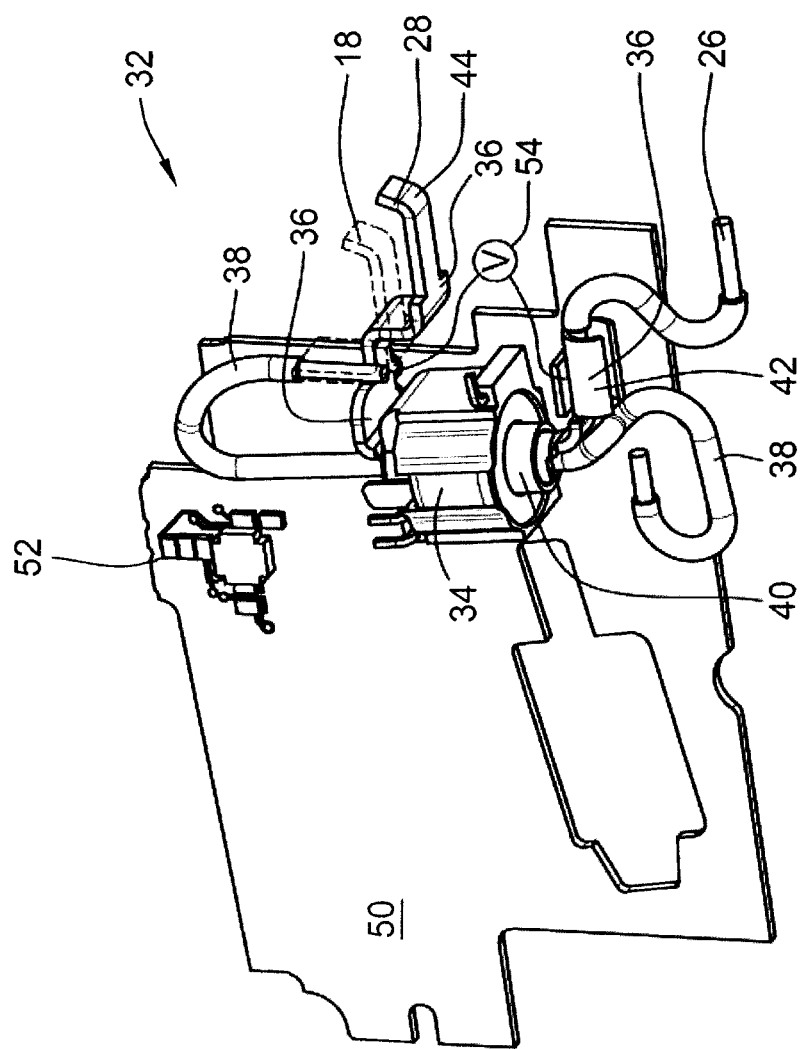
FIG. 4 is a perspective view of a Dual Function circuit breaker printed circuit board (PCB) with the integrated arc fault and ground fault current sensing package of the present invention utilizing one ground fault current transformer.

FIG. 4 shows a perspective view of an arc fault sensing circuit breaker PCB 50 with the integrated arc fault and ground fault current sensing package 32 of the present invention utilizing one ground fault current transformer 34 as the current sensor. As is understood in the art, the current transformer 34 includes a wound toroidal core within its case. Referencing particularly FIG. 4 and FIGS. 5A-C, through the aperture 40 of the toroidal transformer core is passed a rigid conductor 36 surrounding and holding an insulated flexible conductor 38, i.e. a wire, arranged here for carrying the line power current through the circuit breaker and ending at a load terminal 18 for connection to a branch load line. This arrangement creates a so-called "faux coaxial conductor" for use in the integrated arc fault and ground fault current sensing package 32 of the present invention which comprises the current sensor 34, the rigid conductor 36, a voltage meter 54, and associated electronics 52. The rigid conductor 36 is connected to a neutral return wire 26, sometimes known as a pig tail, at a first end 42 of the rigid conductor 36, as part of the neutral current path through the circuit breaker 30. The second end 44 of the rigid connector 36 is formed into the Neutral terminal 28 of the circuit breaker 10 for connection to the neutral line of the branch load (not shown).

The rigid connector 36 is mounted, e.g. soldered, to a printed circuit board (PCB) 50 along with the various electronic components, collectively 52, necessary to perform the circuit interruption functions of the breaker 30. Within the electronic components 52 will be a voltage meter 54 (FIG. 4), whose leads may be incorporated into the PCB 50 and make contact with the rigid conductor 36 where it is soldered to the board such as at one of its pins 57 (FIG. 5B), to be connected across the first end 42 and second end 44 of the rigid conductor 36 for providing the functionality necessary to detect the rapid changes in voltage and current in the rigid conductor 36 indicative of arcing event currents. This arrangement can thereby eliminate the need for a second current transformer for arc fault detection as typically seen in Dual Function miniature circuit breakers of the known art.

Figure 5A:
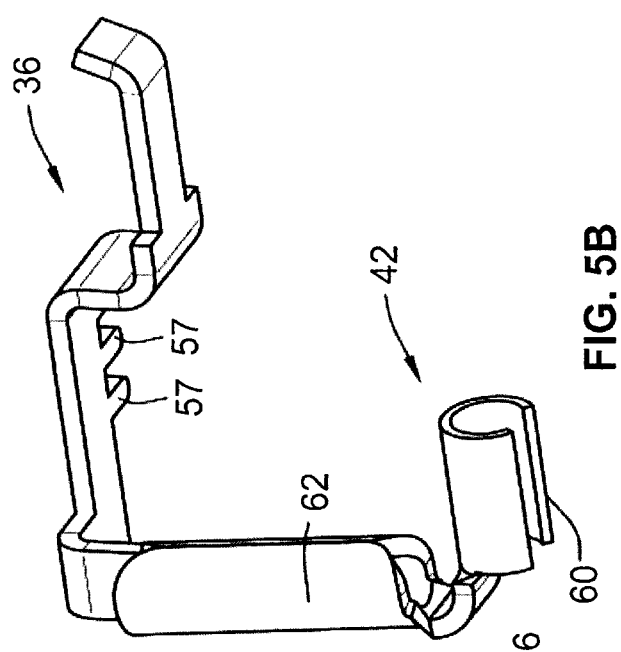
FIGS. 5A, 5B and 5C are exemplary variants of the rigid conductor utilized for assembling the faux co-axial conductors through the Ground Fault Interrupter current transformer.
Figure 5B:
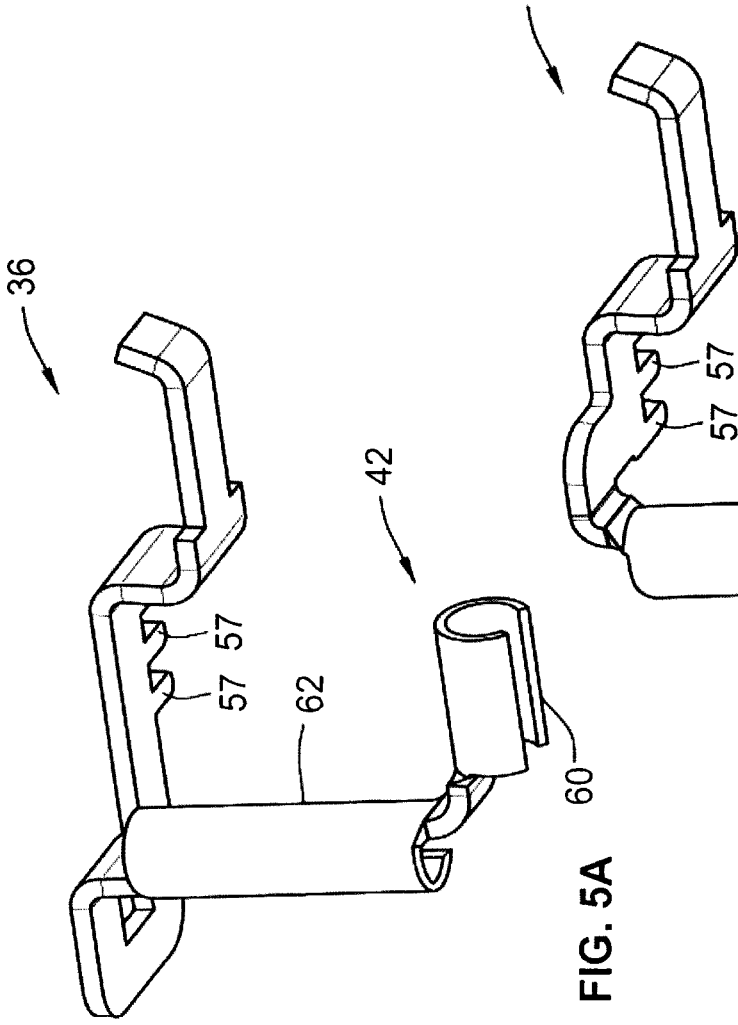
Figure 5C:
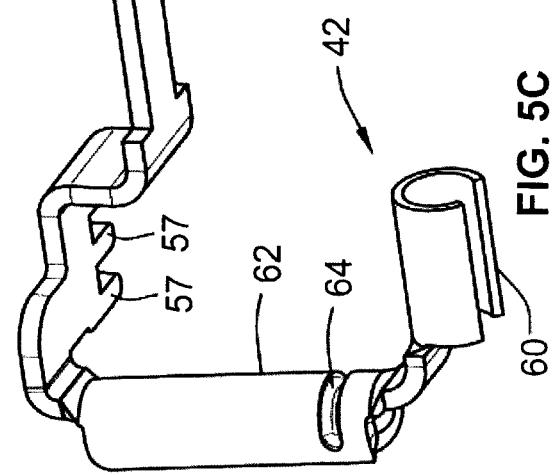

FIGS. 5A, 5B and 5C show three possible variants 36a, 36b, 36c of the rigid conductor 36 utilized for assembling the faux co-axial conductors through the Ground Fault Interrupter current transformer. Each rigid conductor 36a, 36b, 36c can start as a flat plate-like part to be stamped, rolled and bent during the process of constructing the rigid conductor of the faux coax sensor package 32. In each variant, a first end 42 of the rigid conductor 36 is rolled to form an open cylinder tubular connection point 60 for a flexible wire within the breaker. While illustrated in the present description as carrying the Neutral current, it will be appreciated that the rigid conductor 36 could just as well carry the line current in other arrangements. A central tubular portion 62, unclosed here in all three variants, is formed by rolling a wider central portion of the plate. The central portion of FIG. 5A is rolled and/or twisted 180 degrees. The central portion of FIG. 5B is rolled and/or twisted through 90 degrees and the central portion of FIG. 5C has a so-called "zero degree" twist where the edges of the central plate are merely turned up towards one another without a twist through the axis of the starting plate. The central portion of FIG. 5C further has a feature 64 for adding resistance to current flow stamped into the central portion as a reduced thickness of the wall section.

A plurality of variations for the faux coax concept could be utilized to optimize load shift performance as well as line current detection using variations of geometries; some examples being coax shape, length, material thickness, etc.; to optimize voltage drop at both typical 60 Hz or 50 Hz as well as at higher frequency signatures during arcing faults.

The rigid conductor in conjunction with PCB leads might further be used to replace separate jumper wire connections to the module. For instance power and push-to-test (PTT) inputs could be incorporated through the rigid conductor rather than as jumper wires. It will also be appreciated that the body of the rigid conductor could be insulated to reduce dielectric concerns to surrounding components. Likewise it will be appreciated that the rigid conductor 36 could be connected through either the Line Power (hot) wire path or the Neutral Power wire path in the construction of the faux coax arrangement.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the invention as defined in the appended claims.

The invention claimed is:

1. A dual function circuit interrupter device with arc fault and ground fault detection functions, comprising:
   a flexible conductor;
   an apertured current transformer for the detection of ground fault current anomalies;
   a rigid conductor configured to surround and hold the flexible conductor, wherein the rigid conductor and the flexible conductor pass through the aperture of the current transformer, the rigid conductor comprising:
      a central split tubular portion having a first open end and a second open end;
      a second split tubular portion having a first open end;
      a rigid connector that couples the first open end of the central split tubular portion and the first open end of the second split tubular portion at a substantially right angle; and
      a non-tubular neutral terminal coupled to the second open end of the central split tubular portion at a substantially right angle; and
   a voltage meter measuring a voltage drop across the rigid conductor and reporting the voltage drop measurements to an Arc Fault Detector electronics circuit.

2. The dual function circuit interrupter device of claim 1, wherein the device has only one current transformer.

3. The dual function circuit interrupter device of claim 1, wherein the rigid conductor is connected to and forms a part of the neutral return current path.

4. The dual function circuit interrupter device of claim 1, wherein the rigid conductor has electrical resistance features placed within the central split tubular portion to create increased resistance to flow of current through the rigid conductor.

5. The dual function circuit interrupter device of claim 1, wherein an electrical resistance feature in the rigid conductor is created by a narrowed wall thickness in a section of the rigid conductor.

6. The dual function circuit interrupter device of claim 1, wherein the non-tubular neutral terminal includes one or more pins.

7. The dual function circuit interrupter device of claim 1, wherein an opening of the central split tubular portion is oriented substantially 180 degrees from a front side of the rigid conductor.

8. The dual function circuit interrupter device of claim 1, wherein an opening of the central split tubular portion is oriented substantially 90 degrees from a front side of the rigid conductor.

9. The dual function circuit interrupter device of claim 1, wherein an opening of the central split tubular portion is oriented substantially 0 degrees from a front side of the rigid conductor.

10. The dual function circuit interrupter device of claim 1, wherein the non-tubular neutral terminal comprises a flat, rigid terminal constructed from a conductive material.

11. A miniature circuit breaker of the arc fault sensing type comprising:
   a current transformer with an apertured magnetic core;
   a printed circuit board with electronics for detection of ground fault events;
   first and second primary conductors extending through the core;
   the first primary conductor being a substantially rigid conductor comprising:
      a central split tubular portion located inside the apertured magnetic core and having a first open end and a second open end,
      a second split tubular portion having a first open end,
      a rigid connector that couples the first open end of the central split tubular portion and the first open end of the second split tubular portion at a substantially right angle, and
      a non-tubular neutral terminal coupled to the second open end of the central split tubular portion at a substantially right angle secured to the printed circuit board;
   the second primary conductor being a flexible wire held inside the tubular portion of the first primary conductor in a substantially coaxial arrangement;
   the current sensor further having a secondary winding comprising a plurality of turns on the core;
   a trip circuit responsive to sensed signals on the secondary winding; and
   a voltage meter connected across the substantially rigid conductor for detection of arc fault currents.

12. The miniature circuit breaker of claim 11, wherein one of the voltage meter leads is attached to the printed circuit board.

13. The miniature circuit breaker of claim 11, further including wherein the tubular portion does not form a fully closed tube.

14. The miniature circuit breaker of claim 11, wherein the rigid conductor has electrical resistance features placed within the central split tubular portion to create increased resistance to flow of current through the rigid conductor.

15. The miniature circuit breaker of claim 11, an electrical resistance feature in the rigid conductor is created by a narrowed wall thickness in a section of the substantially tubular form.

16. The miniature circuit breaker of claim 11, wherein the non-tubular neutral terminal includes one or more pins.

17. The miniature circuit breaker of claim 11, wherein an opening of the central split tubular portion is oriented substantially 180 degrees from a front side of the rigid conductor.

18. The miniature circuit breaker of claim 11, wherein an opening of the central split tubular portion is oriented substantially 90 degrees from a front side of the rigid conductor.

19. The miniature circuit breaker of claim 11, wherein an opening of the central split tubular portion is oriented substantially 0 degrees from a front side of the rigid conductor.

20. A rigid conductor for use in interrupter devices, comprising:
   a central split tubular portion having a first open end and a second open end, a second split tubular portion having a first open end, a rigid connector that couples the first open end of the central split tubular portion and the first open end of the second split tubular portion at a substantially right angle, and a non-tubular neutral terminal coupled to the second open end of the central split tubular portion at a substantially right angle, wherein the non-tubular neutral terminal includes one or more pins and an opening of the central split tubular portion is oriented 180 degrees from a front side of the rigid conductor.

* * * * *